United States Patent [19]

Berney

[11] 4,092,604
[45] May 30, 1978

[54] APPARATUS FOR ADJUSTING THE OUTPUT FREQUENCY OF A FREQUENCY DIVIDER

[76] Inventor: Jean-Claude Berney, Chemin du Bois de Menton, Epalinges, Switzerland

[21] Appl. No.: 751,974

[22] Filed: Dec. 17, 1976

[51] Int. Cl.² .................. H03K 21/32; H03K 1/16
[52] U.S. Cl. ................................ 328/48; 331/74; 328/61; 328/67; 307/271; 58/23 AC
[58] Field of Search .............. 307/271; 328/46, 48, 328/61, 60, 63, 66, 67, 41, 42, 38; 331/1 A, 74; 58/23 R, 23 AC

[56] References Cited

U.S. PATENT DOCUMENTS

| | | | |
|---|---|---|---|
| 3,241,017 | 3/1966 | Madsen et al. | 307/271 |
| 3,714,589 | 1/1973 | Lewis | 328/48 X |
| 3,802,180 | 4/1974 | Boudry | 58/23 AC |
| 3,805,182 | 4/1974 | Melcher | 331/1 A |
| 3,882,404 | 5/1975 | Bell | 328/38 |
| 3,906,374 | 9/1975 | Fletcher et al. | 328/41 |
| 3,967,205 | 6/1976 | Rossi et al. | 328/46 |

Primary Examiner—John S. Heyman
Attorney, Agent, or Firm—Haseltine, Lake & Waters

[57] ABSTRACT

Apparatus for adjusting the output frequency of a frequency divider comprising a circuit constituted of a resistance R and a capacitor C for receiving output pulses from the divider. A comparator is connected to the RC circuit and to the divider for receiving normal pulses from the divider and pulses with a delay $t$ proportional to the time constant RC for comparing the delay pulses with the normal pulses to produce control pulses of duration $t$. A switching arrangement is coupled to the comparator and to the divider for switching the rate of the divider from an initial rate $n_o$ to a value $n'$ during the duration of the control pulses. The divider has a plurality of outputs and when $n'$ is greater than $n_o$ the RC circuit is connected to one of the outputs while when $n'$ is smaller than $n_o$ the RC circuit is connected to another of the outputs.

7 Claims, 4 Drawing Figures

APPARATUS FOR ADJUSTING THE OUTPUT FREQUENCY OF A FREQUENCY DIVIDER

BACKGROUND

In order to guarantee the precision of an electronic watch or clock comprising a quartz oscillator, a frequency divider and an electronic or electro-mechanical counter of seconds, minutes and hours, it is important to perfectly adjust the output frequency of the frequency divider. The method most generally utilized consists in adjusting the frequency of the oscillator by utilizing a capacitive trimmer connected in the quartz oscillation loop. This method has the main deficiencies of non-linear correction of the frequency as a function of angular displacement of the trimmer, poor stability thereof and a relatively small range of correction. Its utilization is, in contrast, very simple, the frequency correction being memorized by the angular position of the trimmer and not being affected by a change of the batteries.

Other procedures utilize a combination of memories which acts on the division rate of the divider, this rate being dependent on the program which has been preliminarily recorded in the memories. This programming is generally difficult to effect and especially it can vanish at the time of change of the batteries. It is necessary therefore, to provide a buffer accumulator which has low reliability and is relatively high in cost.

SUMMARY OF THE INVENTION

It is an object of the invention to provide apparatus which eliminates the above noted deficiencies and also acts on the mean division rate of the frequency divider without the use of programmed memories.

The apparatus is characterized by the construction wherein a circuit formed by a resistance R and a capacitor C is connected between one output of the frequency divider of initial rate $n_o x$ and the input of an amplifier in order to produce between the output of this amplifier and the output of the divider a delay $t$ proportional to the time constant RC, said output being connected to a comparator circuit which delivers control pulses of duration $t$ to a switching circuit which switches the rate of the frequency divider to a value $n'x$ during the duration of the control pulses.

There is thus obtained a mean rate of division which depends on the constant RC, which can be adjusted, and thereby the frequency of the output of the frequency divider by varying R by means of a potentiometer.

BRIEF DESCRIPTION OF THE DRAWING

The annexed drawing shows two embodiments of the invention given by way of example.

DETAILED DESCRIPTION

Figure 1:
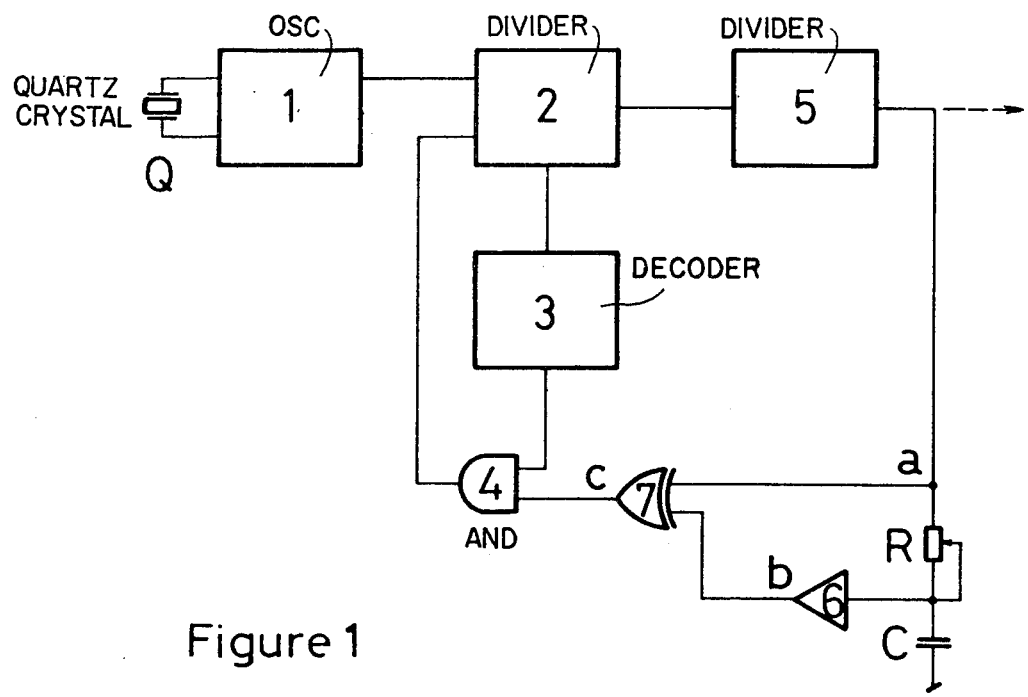
FIG. 1 is a circuit diagram corresponding to the first embodiment.

In the embodiment according to FIG. 1 the oscillation of quartz crystal Q is maintained by oscillator 1 whose output is applied to the input of a divider 2 of rate $n_o$. The outputs representing the state of the divider are applied to the input of a decoder 3 which delivers a positive pulse to the input and an AND gate 4 when the state of the divider is in a given position $n'$. The output of the gate 4 is connected to the "reset to zero" input of the divider 2 whose output is connected to the input of divider 5 of the rate X.

The output of divider 5 is connected, on the one hand, to the first input of an OR EXCLUSIVE gate 7 and, on the other hand, to a terminal of a variable resistance R whose other terminal is connected to the input of an amplifier 6 and to a capacitor C connected to ground. The output of the amplifier 6 is connected to the second input of the gate 7 whose output is connected to the other input of gate 4.

Figure 2:
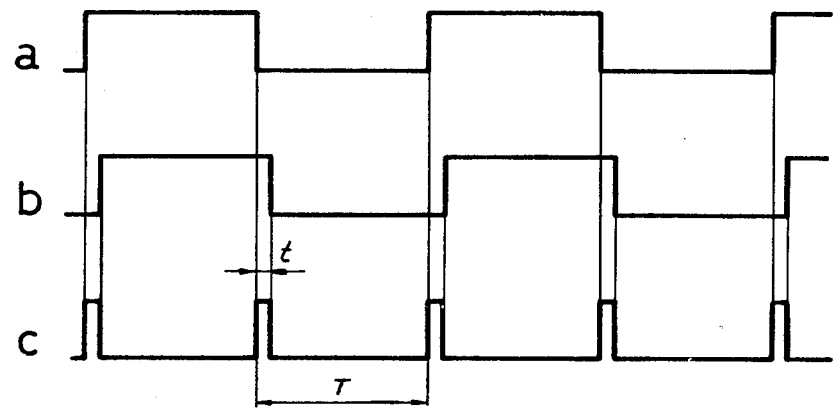
FIG. 2 shows the voltage forms at different points of the circuit of FIG. 1.

The operation of the described apparatus is as follows (see FIG. 2):

When the output $a$ of the divider 5 passes to 1, the capacitor C is charged through the variable resistance R. After a certain lapse of time $t$ which depends on the time constant RC, the voltage at the terminals of the capacitor reaches the level for de-energization of the amplifier 6 whose output $b$ also passes to 1. The OR EXCLUSIVE gate 7 detects the delay $t$ between the outputs a and b and delivers positive pulses of width $t$ to the gate 4 which switches and passes the decoded pulses from the output of decoder 3 and resets the divider 2 to zero when the state of the divider is at $n'$. The rate of division of the divider 2 is, therefore, $n'$ during the duration $t$ of the pulses at the point C.

The frequency of the mean output is calculated as follows:

$$fs = \frac{\frac{fQ}{n'x} t + \frac{fQ}{n_o x}(T-t)}{T}$$

$$fo = \frac{fQ}{n_o x}$$

$$\frac{\Delta fs}{fo} = \frac{fs - fo}{fo} = \frac{t}{T}\left(\frac{n_o}{n'} - 1\right)$$

$fQ$ = the frequency of the oscillator $fs$ = the output frequency $T$ = the output period It is seen from this formula that the relative correction of the output frequency is proportional to the time $t$ which is itself proportional to the time constant RC. By varying R by means of a linear potentiometer, one, therefore, obtains a frequency correction proportional to the angular displacement of the potentiometer which is an important advantage with respect to the capacitive trimmer.

In the circuit of FIG. 1, $n'$ is necessarily smaller than $n_o$ which leads to positive corrections of the frequency. One can also construct the circuit such that if $n'$ is greater than $n_o$ negative corrections of negative frequency are produced. The two possibilities can be provided in the same circuit with automatic switching means.

Figure 3:
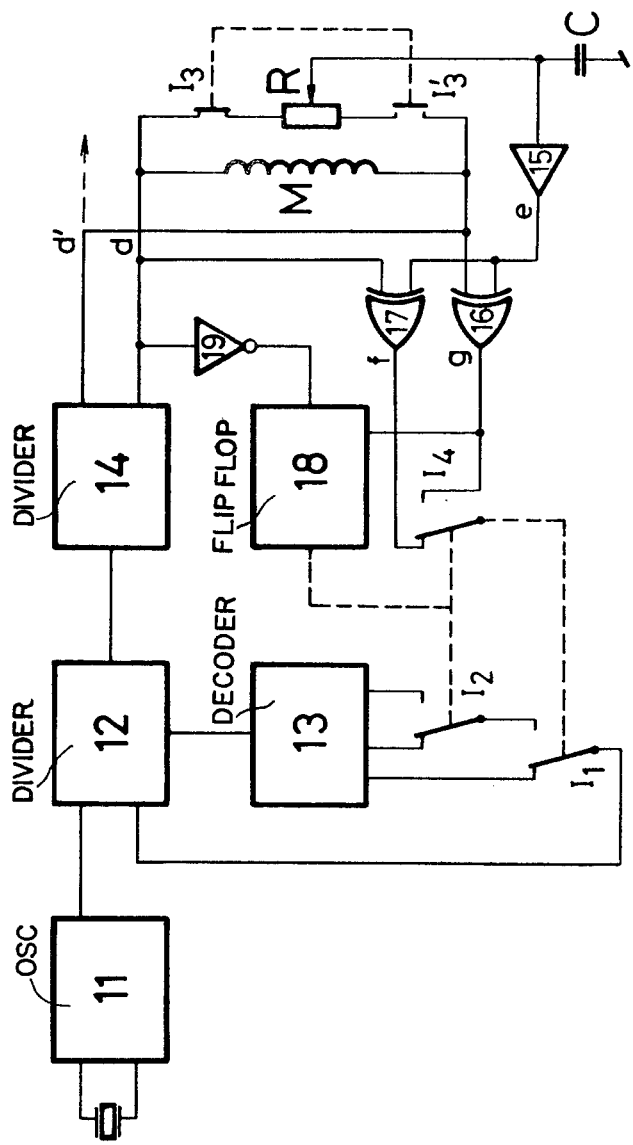
FIG. 3 is a circuit diagram of an apparatus according to the second embodiment which utilizes existing outputs of the divider circuit.

The circuit diagram of the second embodiment of FIG. 3 represents such a combination.

The output of the oscillator 11 is applied here to the input of divider 12 whose outputs are connected to a decoder 13 which decodes the states $n_o$, $n'_a$ and $n'_r$ of the divider. The output corresponding to the state $n_o$ is connected to an electronic switch $I_1$ while the output corresponding to the states $n'_a$ and $n'_r$ are connected to an electronic switch $I_2$ whose output is connected to $I_1$, the output of which is connected to the reset to zero input of the divider 12. The output of the divider 12 is connected to the input of divider 14 which delivers even control pulses $d$ and odd control pulses $d'$ to the terminals of a motor M. A coupled switch $I_3$, $I'_3$ connects one of the terminals of the potentiometer R to the output of even pulses or the other terminal to the output of the odd pulses. The slide of the potentiometer R is connected to the capacitor C and to the input of an amplifier 15 whose output is connected to the OR EXCLUSIVE gates 16 and 17 whose outputs, respectively, are connected to the electronic switch $I_4$ whose output controls the electronic switch $I_1$.

In the circuit diagram, the switches are shown in conventional form to facilitate the understanding. In reality, these electronic switches are constituted by means of "transmission gates" of the C-MOS technique. The second input of the gate 17 is connected to the output $d$ of divider 14. The output of the gate 16 is connected to the data input of a flip-flop 18 whose inverse output controls the switches $I_2$ and $I_4$. The clock input of the flip-flop 18 is connected to the output of an inverter 19 whose input is connected to the output $d$.

Figure 4:
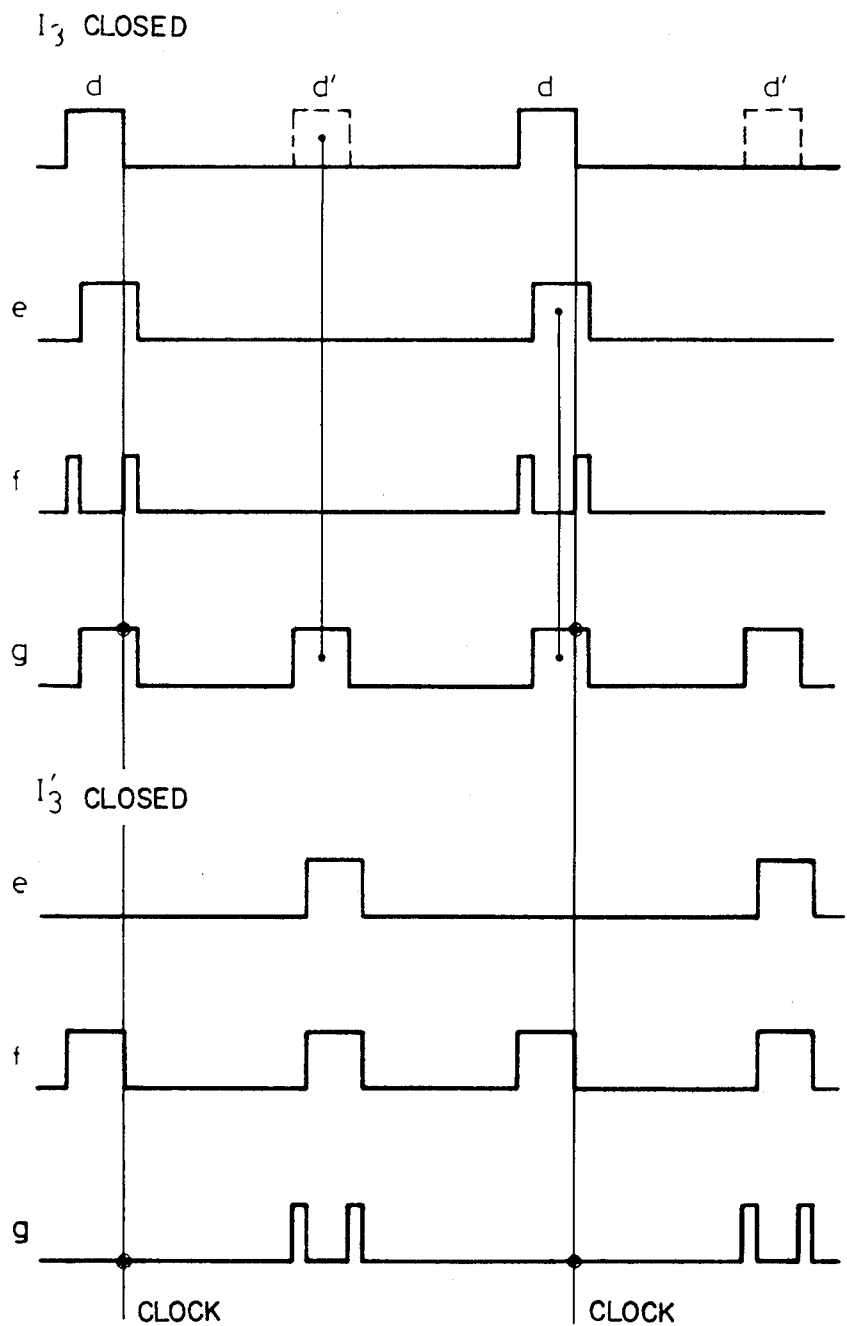
FIG. 4 shows the voltage forms at different points of the circuit of FIG. 3.

The operation of the second embodiment is as follows (see FIG. 4):

When $I_3$ is closed and $I'_3$ open, the negative wave front of the even pulse $d$ arrives at the time when the data input of the flip-flop 18 is at 1. Its inverse output, therefore, switches to 0. The switches $I_2$ and $I_4$ are in rest position and the output $f$ of the gate 17 controls the switch $I_1$. The rate of division of divider 12 will therefore be $n_o$ during T-$t$ and $n'_a$ during the time $t$ corresponding to the duration of the positive pulses at $f$. The frequency correction obtained is, therefore, $$\frac{\Delta fQ}{f_o} = \frac{t}{T}\left(\frac{n_o}{n'_a} - 1\right) \quad n'Q < n_o$$

When $I_3$ is open and $I'_3$ closed, the negative wave front of the even pulse $d$ arrives at the time when the data input $d$ of the flip-flop 18 is at 0 (point $g$). The inverse output therefore switches to 1 and the switches $I_2$ an $I_4$ pass to operating position. The output $g$ of the gate 16 controls the switch $I_1$. The rate of division of the divider 12 therefore is $n_o$ during the time T-$t$ and $n'_r$ during the time $t$ corresponding to the duration of the positive pulses at $g$. The frequency correction obtained will therefore be $$\frac{\Delta fr}{f_o} = \frac{t}{T}\left(\frac{n_o}{n'_r} - 1\right) \quad n'_r > n_o$$

Therefore, by a simple switching the capacity of the correction of the potentiometer can be doubled. Taking, for example, $n_o = 4$, $n'_a = 3$ and $n'_r = 6$, there is obtained for $I_3$ closed:

$$\frac{\Delta fQ}{f_o} = \frac{t}{T}\left(\frac{4}{3} - 1\right) = +\frac{1}{3}\frac{t}{T}$$

For $I_3$ open:

$$\frac{\Delta fr}{f_o} = \frac{t}{T}\left(\frac{4}{6} - 1\right) = -\frac{1}{3}\frac{t}{T}$$

The system is symmetrical.

It is noted that one can also modify the division rate of the divider by adding or eliminating pulses at its input in a manner to obtain the rates $n'_a$ and $n'_r$.

What is claimed is:

1. Apparatus for adjusting the output frequency of a frequency divider having two inputs one for an initial rate $n_o x$ and a second for a rate of $n'x$, said frequency divider having an output, said apparatus comprising a circuit constituted of a resistance R and a capacitor C, said circuit having an input connected to the output of the frequency divider for receiving output pulses from the divider, said circuit having an output, comparator means having one input connected to the output of the RC circuit and a second input connected to the output of the divider for receiving normal pulses from the divider and pulses with a delay $t$ proportional to the time constant RC from the RC circuit for comparing the delayed pulses with the normal pulses, said comparator means having an output at which are produced control pulses of duration $t$, and switching means coupled to the output of said comparator means and to said divider for switching the rate of the divider to the value $n'x$ during the duration of the control pulses.

2. Apparatus as claimed in claim 1 wherein said resistance is a variable resistance potentiometer.

3. Apparatus as claimed in claim 1 comprising an amplifier connected to the output of the RC circuit and the input of the comparator means.

4. Apparatus as claimed in claim 3 wherein said switching means comprises a decoder connected to the output of the divider, and an AND gate connected to said decoder and to said comparator means.

5. Apparatus as claimed in claim 1 wherein said second input of the divider is a reset to zero input.

6. Apparatus as claimed in claim 1 wherein said divider has a plurality of distinct outputs, the circuit further comprising operating means selectively connecting the RC circuit to said outputs for producing rate $n'$ which is greater than $n_o$ when the RC circuit is connected to one of the outputs and rate $n'$ which is less than $n_o$ when the RC circuit is connected to another of these outputs.

7. Apparatus as claimed in claim 6 wherein said operating means comprises a motor having opposite terminals respectively connected to the RC circuit in correspondence with the connection of the RC circuit to the outputs of the divider.

* * * * *